United States Patent
Kozicki

(10) Patent No.: US 6,865,117 B2
(45) Date of Patent: Mar. 8, 2005

(54) PROGRAMMING CIRCUIT FOR A PROGRAMMABLE MICROELECTRONIC DEVICE, SYSTEM INCLUDING THE CIRCUIT, AND METHOD OF FORMING THE SAME

(75) Inventor: Michael N. Kozicki, Phoenix, AZ (US)

(73) Assignee: Axon Technologies Corporation, Scottsdale, AZ (US)

(*) Notice: Subject to any disclaimer, the term of this patent is extended or adjusted under 35 U.S.C. 154(b) by 204 days.

(21) Appl. No.: 10/335,705

(22) Filed: Jan. 2, 2003

(65) Prior Publication Data
US 2003/0156447 A1 Aug. 21, 2003

Related U.S. Application Data

(63) Continuation-in-part of application No. 10/118,276, filed on Apr. 8, 2002, now Pat. No. 6,825,489, which is a continuation-in-part of application No. 09/502,915, filed on Feb. 11, 2000, now Pat. No. 6,487,106, and a continuation-in-part of application No. 09/951,882, filed on Sep. 10, 2001, now Pat. No. 6,635,914

(60) Provisional application No. 60/345,931, filed on Jan. 3, 2002.

(51) Int. Cl.$^7$ ............................................. G11C 7/00
(52) U.S. Cl. .................. 365/189.09; 365/107; 365/153
(58) Field of Search ......................... 365/189.09, 107, 365/153

(56) References Cited

U.S. PATENT DOCUMENTS 5,321,659 A * 6/1994 Taguchi ...................... 365/207

* cited by examiner

Primary Examiner—Son T. Dinh
(74) Attorney, Agent, or Firm—Snell & Wilmer L.L.P.

(57) ABSTRACT

A circuit for programming a microelectronic device is disclosed. The circuit is configured to provide a reversible bias across the microelectronic device to perform erase and write functions. One configuration of the programming circuit includes one or more inputs coupled to the programmable device and a complimentary metal-oxide semiconductor circuit coupled to the programmable device. This design allows for writing and erasing of the programmable cell using a low and high voltage input.

19 Claims, 7 Drawing Sheets

PROGRAMMING CIRCUIT FOR A PROGRAMMABLE MICROELECTRONIC DEVICE, SYSTEM INCLUDING THE CIRCUIT, AND METHOD OF FORMING THE SAME

CROSS REFERENCE TO RELATED APPLICATIONS

This application is a continuation-in-part and claims the benefit of U.S. patent application Ser. No. 10/118,276 entitled MICROELECTRONIC DEVICE, STRUCTURE, AND SYSTEM, INCLUDING A MEMORY STRUCTURE HAVING A VARIABLE PROGRAMMABLE PROPERTY AND METHOD OF FORMING SAME, filed Apr. 8, 2002, now U.S. Pat. No. 6,825,489, which is a continuation-in-part of application Ser. No. 09/502,915, entitled PROGRAMMABLE MICROELECTRONIC DEVICES AND METHODS OF FORMING AND PROGRAMMING SAME, filed Feb. 11, 2000, which issued as U.S. Pat. No. 6,487,106; and is a continuation-in-part of U.S. patent application Ser. No. 09/951,882, entitled MICROELECTRONIC PROGRAMMABLE DEVICE AND METHODS OF FORMING AND PROGRAMMING THE SAME, filed Sep. 10, 2001; now U.S. Pat. No. 6,635,914 and claims the benefit of U.S. Patent Application Ser. No. 60/345,931 entitled PROGRAMMABLE CIRCUITRY FOR THE PROGRAMMABLE METALLIZATION CELL, filed Jan. 3, 2002.

1. Field of Invention

The present invention generally relates to programmable microelectronic devices. More particularly, the invention relates to a circuit for applying a write and/or erase voltage to a device having an electrical property that can be variably programmed by manipulating an amount and/or polarity of energy supplied to the device.

2. Background of the Invention

Memory devices are often used in electronic systems and computers to store information in the form of binary data. These memory devices may be characterized into various types, each type having associated with it various advantages and disadvantages.

For example, random access memory ("RAM"), which may be found in personal computers, is typically volatile semiconductor memory; in other words, the stored data is lost if the power source is disconnected or removed. Dynamic RAM ("DRAM") is particularly volatile in that it must be "refreshed" (i.e., recharged) every few hundred milliseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off. In general, these RAM devices can take up significant chip area and therefore may be expensive to manufacture and consume relatively large amounts of energy for data storage. Accordingly, improved memory devices suitable for use in personal computers and the like are desirable.

Other storage devices such as magnetic storage devices (e.g., floppy disks, hard disks and magnetic tape) as well as other systems, such as optical disks, CD-RW and DVD-RW are non-volatile, have extremely high capacity, and can be rewritten many times. Unfortunately, these memory devices are physically large, are shock/vibration-sensitive, require expensive mechanical drives, and may consume relatively large amounts of power. These negative aspects make such memory devices non-ideal for low power portable applications such as lap-top and palm-top computers, personal digital assistants ("PDAs"), and the like.

Due, at least in part, to a rapidly growing numbers of compact, low-power portable computer systems and hand-held appliances in which stored information changes regularly, low energy read/write semiconductor memories have become increasingly desirable and widespread. Furthermore, because these portable systems often require data storage when the power is turned off, nor-volatile storage device are desired for use in such systems.

One type of programmable semiconductor non-volatile memory device suitable for use in such systems is a programmable read-only memory ("PROM") device. One type of PROM, a write-once read-many ("WORM") device, uses an array of fusible links. Once programmed, the WORM device cannot be reprogrammed.

Other forms of PROM devices include erasable PROM ("EPROM") and electrically erasable PROM (EEPROM) devices, which are alterable after an initial programming. EPROM devices generally require an erase step involving exposure to ultra violet light prior to programming the device. Thus, such devices are generally not well suited for use in portable electronic devices. EEPROM devices are generally easier to program, but suffer from other deficiencies. In particular, EEPROM devices are relatively complex, are relatively difficult to manufacture, and are relatively large. Furthermore, a circuit including EEPROM devices must withstand the high voltages necessary to program the device. Consequently, EEPROM cost per bit of memory capacity is extremely high compared with other means of data storage. Another disadvantage of EEPROM devices is that, although they can retain data without having the power source connected, they require relatively large amounts of power to program. This power drain can be considerable in a compact portable system powered by a battery.

Other forms of electronic memory such as FLASH memory are also relatively expensive and complicated to manufacture. Accordingly, improved memory devices that are relatively easy to manufacture and that Are relatively inexpensive to manufacture are desired. In addition, circuits for programming the devices are desirable.

SUMMARY OF THE INVENTION

The present invention provides improved microelectronic programmable circuits, structures, and systems and methods of forming the same. More particularly, the invention provides programming circuits suitable for providing write and/or erase voltages to programmable device. Systems including such circuits and the corresponding programmable structures can replace both traditional nonvolatile and volatile forms of memory.

The ways in which the present invention addresses various drawbacks of now-known programmable devices and systems are discussed in greater detail below. However, in general, the present invention provides a programming circuit and a corresponding programmable device that are relatively easy and inexpensive to manufacture and are relatively easy to program.

In accordance with various exemplary embodiments of the present invention, a programmable structure includes an ion conductor and at least two electrodes. The structure is configured such that when a bias having a first polarity is applied across two electrodes, one or more electrical properties of the structure change. In accordance with one aspect of this embodiment, a resistance across the structure changes when the bias having a first polarity is applied across the electrodes. In accordance with other aspects of this embodiment, a capacitance or other electrical property of the structure changes upon application of the bias, having a first polarity, across the electrodes. In accordance with additional aspects of this embodiment, the change in electrical property can be reversed by application of a sufficient bias having a second polarity. One or more of these electrical changes may suitably be detected. Thus, stored information may be retrieved from a circuit including the structure.

In accordance with the present invention, a circuit for programming and/or erasing the programmable device includes a plurality of voltage inputs and a plurality of switches coupled between a voltage source and ground and to the voltage inputs. In accordance with various aspects of this embodiment of the invention, the programming circuit is configured to write and erase the programmable device using a first voltage (e.g. a positive voltage) and a second voltage (e.g. zero or near zero voltage). In accordance with one particular aspect of this embodiment of the invention, the programming circuit includes a complimentary metal-oxide-semiconductor (CMOS) circuit coupled to a voltage input and the programmable device. In accordance with various other aspects of this embodiment, the programming circuit includes a passive load and/or an active load.

In accordance with additional embodiments of the invention, a circuit for programming and/or erasing the programmable device includes a single write voltage input, a plurality of switches coupled between a voltage source and ground and to the write voltage input, and a select switch coupled between the write voltage input and the programmable device. The select switch allows a particular programmable structure within an array of structures to be selected for either a write or an erase process.

In accordance with another embodiment of the invention, a programmable device may be formed on a surface of a substrate, which includes the programming circuit. In accordance with a further aspect of this embodiment, the programmable device is formed overlying the programming circuit and conductive lines between the programming circuit and the programmable device are formed using conductive wiring schemes within the substrate and the programmable structure.

BRIEF DESCRIPTION OF THE DRAWING FIGURES

A more complete understanding of the present invention may be derived by referring to the detailed description and claims, considered in connection with the figures, wherein like reference numbers refer to similar elements throughout the figures, and:

FIGS. 1, 2, and 4 are cross-sectional illustrations of a programmable structure formed on a surface of a substrate in accordance with the present invention;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention may be described herein in terms of various functional components. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where an effective reversible polarity is desired. Such general applications that may be appreciated by those skilled in the art in light of the present disclosure are not described in detail. Further, it should be noted that while various components may be suitably coupled or connected to other components within exemplary circuits, such connections and couplings can be realized by direct connection between components or by connection through other components and devices located therebetween.

Figure 1:
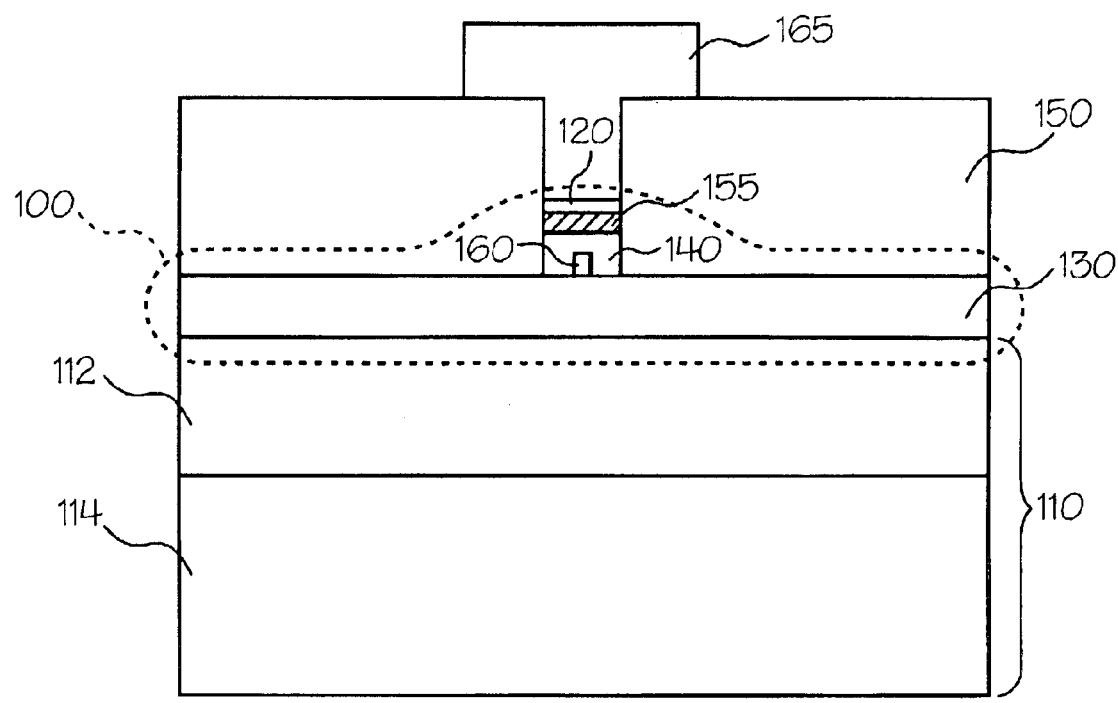
Figure 2:
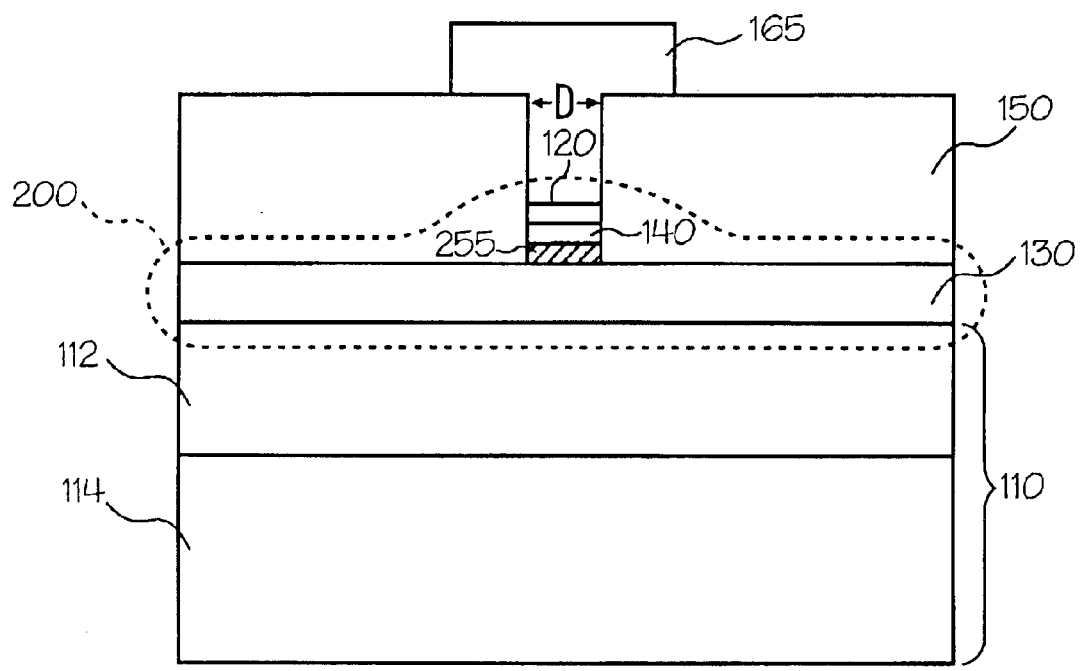

The present invention generally relates to a programming circuit for programmable microelectronic devices, to systems including the circuits, and to methods of forming the circuits and systems. FIGS. 1 and 2 illustrate programmable microelectronic structures 100 and 200 formed on a surface of a substrate 110 suitable for use with the programming circuit and system of the present invention. Structures 100 and 200 include electrodes 120 and 130, an ion conductor 140, and optionally include buffer or barrier layers or regions 155 and/or 255.

Generally, structures 100 and 200 are configured such that when a bias greater than a threshold voltage ($V_T$), discussed in more detail below, is applied across electrodes 120 and 130, the electrical properties of structure 100 change. For example, in accordance with one embodiment of the invention, as a voltage $V \geq V_T$ is applied across electrodes 120 and 130, conductive ions within ion conductor 140 begin to migrate and form a region 160 (e.g., an electrodeposit) having an increased conductivity compared to the bulk ion conductor at or near the more negative of electrodes 120 and 130. As region 160 forms, the resistance between electrodes 120 and 130 decreases, and other electrical properties may also change. In the absence of any barriers, which are discussed in more detail below, the threshold voltage required to grow region 160 from one electrode toward the other and thereby significantly reduce the resistance of the device is approximately the reduction/oxidation potential of the system, typically a few hundred millivolts. If the same voltage is applied in reverse, region 160 will dissolve back into the ion conductor and the device will return to a high resistance or erased state.

Structures 100 and 200 may be used to store information and thus may be used in memory circuits. For example, structure 100 or other programmable structures in accordance with the present invention may suitably be used in memory devices to replace DRAM, SRAM, PROM, EPROM, EEPROM, FLASH devices, or any combination of such memory. In addition, programmable structures of the present invention may be used for other applications where programming or changing of electrical properties of a portion of an electrical circuit are desired.

In accordance with various embodiments of the invention, the volatility of programmable memory (e.g., cell 100 or 200) can be manipulated by altering an amount of energy (e.g., altering time, current, voltage, thermal energy, and/or the like) applied during a write process. In the case where region 160 forms during a write process, the greater the amount of energy (having a voltage greater than the threshold voltage for the write process) applied during the write process, the greater the growth of region 160 and hence the less volatile the memory. Conversely, relatively volatile easily erased memory can be formed by supplying relatively little energy to the cell. Thus, relatively volatile memory can be formed using the same or similar structures used to form nonvolatile memory, and less energy can be used to form the volatile/easily erased memory. Use of less energy is particularly desirable in portable electronic devices that depend on stored energy for operation. The volatile and nonvolatile memory may be formed on the same substrate and partitioned or separated from each other such that each partition is dedicated to either volatile or nonvolatile memory; or, an array of memory cells may be configured as volatile or nonvolatile memory using programming techniques, such that the configuration (i.e., volatile or nonvolatile) of the memory can be altered by changing an amount of energy supplied during programming the respective portions of the memory array.

Referring again to FIGS. 1 and 2, substrate 110 may include any suitable material. For example, substrate 110 may include semiconductive, conductive, semiinsulative, insulative material, or any combination of such materials. In accordance with one embodiment of the invention, substrate 110 includes an insulating material 112 and a portion 114 including a microelectronic devices formed using a portion of the substrate. As discussed in more detail below, microelectronic device 114 may include a programming circuit for structures 100 and/or 200. Layer 112 and portion 114 may be separated by additional layers (not shown) such as, for example, layers typically used to form integrated circuits. Because the programmable structures can be formed over insulating or other materials, the programmable structures of the present invention are particularly well suited for applications where substrate (e.g., semiconductor material) space is a premium. In addition, forming a memory cell overlying a microelectronic device may be advantageous because such a configuration allows greater data transfer between an array of memory cells and the microelectronic device using, for example, conductive plugs formed within layers 112 and 150.

Electrodes 120 and 130 may be formed of any suitable conductive material. For example, electrodes 120 and 130 may be formed of doped polysilicon material or metal.

In accordance with one exemplary embodiment of the invention, one of electrodes 120 and 130 is formed of a material including a metal that dissolves in ion conductor 140 when a sufficient bias ($V \geq V_T$) is applied across the electrodes (an oxidizable electrode) and the other electrode is relatively inert and does not dissolve during operation of the programmable device (an indifferent electrode). For example, electrode 120 may be an anode during a write process and be comprised of a material including silver that dissolves in ion conductor 140 and electrode 130 may be a cathode during the write process and be comprised of an inert material such as tungsten, nickel, molybdenum, platinum, metal silicides, and the like. Having at least one electrode formed of a material including a metal which dissolves in ion conductor 140 facilitates maintaining a desired dissolved metal concentration within ion conductor 140, which in turn facilitates rapid and stable region 160 formation within ion conductor 140 or other electrical property change during use of structure 100 and/or 200. Furthermore, use of an inert material for the other electrode (cathode during a write operation) facilitates electrodissolution of any region 160 that may have formed and/or return of the programmable device to an erased state after application of a sufficient voltage.

Programmable structures may be configured in a variety of ways and formed of a variety of material, depending on, for example, desired write or erase properties. Various programmable structure configurations and materials for forming the structures are disclosed in application Ser. No. 10/268,107, entitled PROGRAMMABLE MICROELECTRONIC DEVICE, STRUCTURE, AND SYSTEM AND METHOD OF FORMING THE SAME and filed Oct. 9, 2002, the contents of which are hereby incorporated herein by reference.

In accordance with one embodiment of the invention, at least one electrode 120 and 130 is formed of material suitable for use as an interconnect metal. For example, electrode 130 may form part of an interconnect structure within a semiconductor integrated circuit. In accordance with one aspect of this embodiment, electrode 130 is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

Ion conductor 140 is formed of material that conducts ions upon application of a sufficient voltage. Suitable materials for ion conductor 140 include polymers, glasses and semiconductor materials. In one exemplary embodiment of the invention, ion conductor 140 is formed of chalcogenide material.

Ion conductor 140 may also suitably include dissolved and/or dispersed conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. An exemplary chalcogenide glass with dissolved metal in accordance with the present invention includes a solid solution of $As_xS_{1-x}$—Ag, $As_xSe_{1-x}$—Ag, $As_xTe_{1-x}$—Ag, $Ge_xSe_{1-x}$—Ag, $Ge_xS_{1-x}$—Ag, $Ge_xTe_{1-x}$—Ag, $As_xS_{1-x}$—Cu, $As_xSe_{1-x}$—Cu, $As_xTe_{1-x}$—Cu, $Ge_xSe_{1-x}$—Cu, $Ge_xS_{1-x}$—Cu, and $Ge_xTe_{1-x}$—Cu where x ranges from about 0.1 to about 0.5, other chalcogenide materials including silver, copper, combinations of these materials, and the like. In addition, conductor 140 may include network modifiers that affect mobility of ions through conductor 140. For example, materials such as metals (e.g., silver), halogens, halides, or hydrogen may be added to conductor 140 to enhance ion mobility and thus increase erase/write speeds of the structure. Furthermore, ion conductor 140 may include a plurality of regions having different resistance values—for example, ion conductor 140 may include a first region proximate the oxidizable electrode having a relatively low resistance and a second region proximate the indifferent electrode having a relatively high resistance.

In accordance with one exemplary embodiment of the invention, at least a portion of structure 100 is formed within a via of an insulating material 150. Forming a portion of structure 100 within a via of an insulating material 150 may be desirable because, among other reasons, such formation allows relatively small structures, e.g., on the order of 10 nanometers, to be formed. In addition, insulating material 150 facilitates isolating various structures 100 from other electrical components.

Insulating material 150 suitably includes material that prevents undesired diffusion of electrons and/or ions from structure 100. In accordance with one embodiment of the invention, material 150 includes silicon nitride, silicon oxynitride, polymeric materials such as polyimide or parylene, or any combination thereof.

A contact 165 may suitably be electrically coupled to one or more electrodes 120, 130 to facilitate forming electrical contact to the respective electrode. Contact 165 may be formed of any conductive material and is preferably formed of a metal, alloy, or composition including aluminum, tungsten, or copper.

Information may be stored using programmable structures of the present invention by manipulating one or more electrical properties of the structures. For example, a resistance of a structure may be changed from a "0" or off state to a "1" or on state during a suitable write operation. Similarly, the device may be changed from a "1" state to a "0" state during an erase operation. In addition, as discussed in application Ser. No. 10/268,107, the structure may have multiple programmable states such that multiple bits of information are stored in a single structure.

Write Operation

Figure 3:
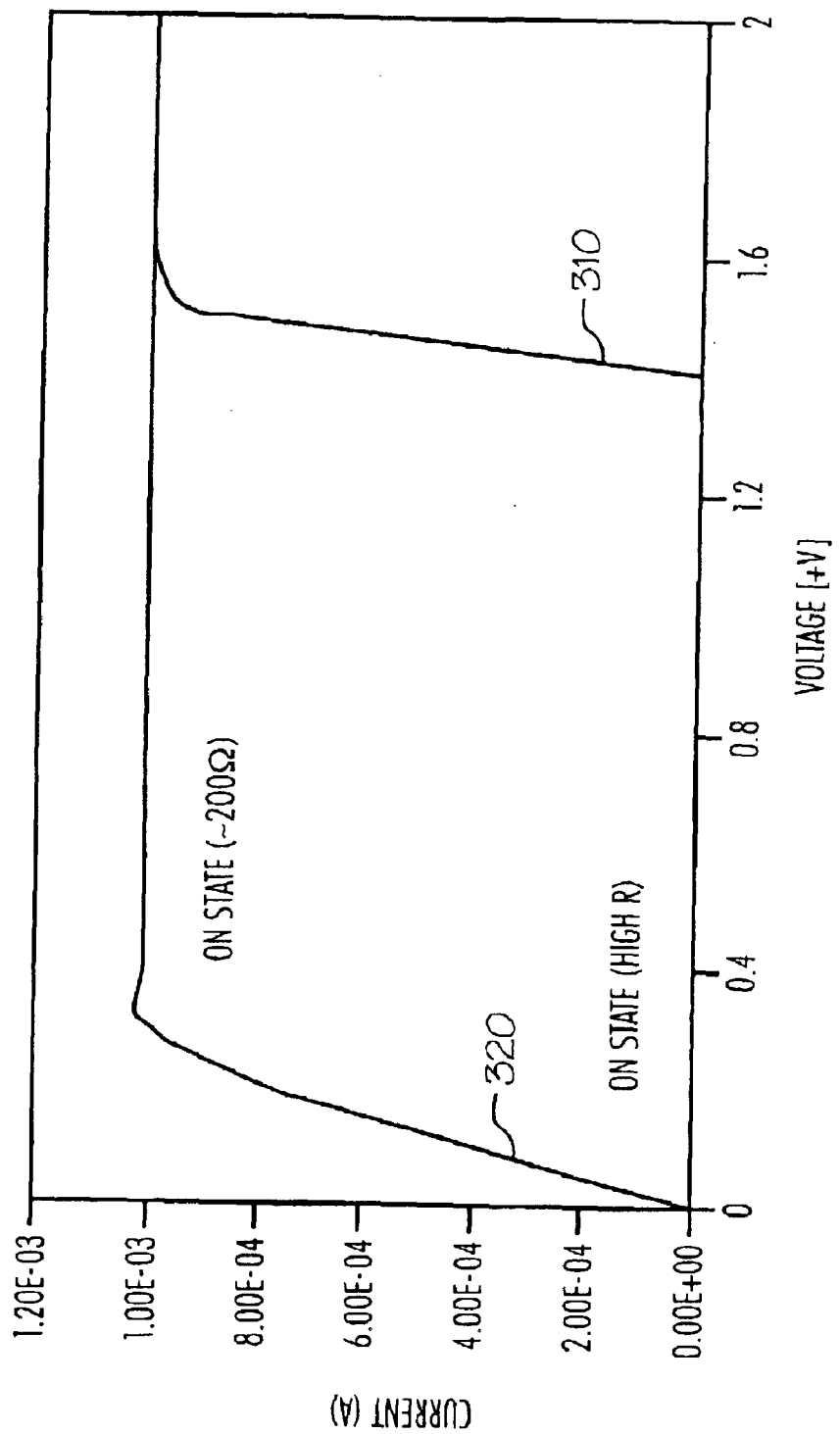
FIG. 3 is a current-voltage diagram illustrating current and voltage characteristics of the devices of the present invention.

FIG. 3 illustrates current-voltage characteristics of a programmable structure (e.g. structure 200) in accordance with the present invention. In the illustrated embodiment, via diameter, D, is about 4 microns, conductor 140 is about 35 nanometers thick and formed of $Ge_3Se_7$-Ag (near $Ag_8Ge_3Se_7$), electrode 130 is indifferent and formed of nickel, electrode 120 is formed of silver, and barrier 255 is a native nickel oxide. As illustrated in FIG. 3, current through structure 200 in an off state (curve 310) begins to rise upon application of a bias of over about one volt; however, once a write step has been performed (i.e., an electrodeposit has formed), the resistance through conductor 140 drops significantly (i.e., to about 200 ohms), illustrated by curve 320 in FIG. 3. As noted above, when electrode 130 is coupled to a more negative end of a voltage supply, compared to electrode 120, a conductive region begins to form near electrode 130 and grow toward electrode 120. An effective threshold voltage (i.e., voltage required to cause growth of the conductive region and to break through barrier 255, thereby coupling electrodes 120, 130 together) is relatively high because of barrier 255. In particular, a voltage $V \geq V_T$ must be applied to structure 200 sufficient to cause electrons to tunnel through barrier 255 (when barrier 255 comprises an insulating layer) to form the conductive region and to overcome the barrier (e.g., by tunneling through or leakage) and conduct through conductor 140 and at least a portion of barrier 255.

In accordance with alternate embodiments of the invention, where no insolating barrier layer is present, an initial "write" threshold voltage is relatively low because no insulative barrier is formed between, for example, ion conductor 140 and either of the electrodes 120, 130.

As noted above, the relative volatility of the memory structures of the present invention may be altered by applying different amounts of energy to the structures during a write process. For example, a relatively high current pulse of a few hundred micro amperes for a period of about several hundred nanoseconds may be applied to the structures illustrated in FIGS. 1 and 2 to form a relatively nonvolatile memory cell. Alternatively, the same current may be supplied to the same or similar memory structure for a shorter amount of time, e.g., several nanoseconds to form a relatively volatile memory structure. In either case, the memory of the present invention can be programmed at relatively high speeds and even the "volatile" memory is relatively nonvolatile compared to traditional DRAM. For example, the volatile memory may operate at speed comparable to DRAM and only require refreshing every several hours.

Read Operation

A state of a memory cell (e.g. 1 or 0) may be read, without significantly disturbing the state, by, for example, applying a forward or reverse bias of magnitude less than a voltage threshold (about 1.4 V for a structure illustrated in FIG. 3) for electrodeposition or by using a current limit which is less than or equal to the minimum programming current (the current which will produce the highest of the on resistance values). A current limited (to about 1 milliamp) read operation is illustrated in FIG. 3. In this case, the voltage is swept from 0 to about 2 V and the current rises up to the set limit (from 0 to 0.2 V), indicating a low resistance (ohmic/linear current-voltage) "on" state. Another way of performing a non-disturb read operation is to apply a pulse, with a relatively short duration, which may have a voltage higher than the electrochemical deposition threshold voltage such that no appreciable Faradaic current flows, i.e., nearly all the current goes to polarizing/charging the device and not into the electrodeposition process.

In accordance with various embodiments of the invention, circuits including the programmable structures include temperature compensation devices to mitigate effects of temperature variation on the performance of the programmable device. One exemplary temperature compensation circuit includes a programmable structure having a known erased state. In this case, during a read operation, a progressively increasing voltage is applied to a programmable structure having an unknown state as well as to the structure having the known erased state. If the unknown structure has been written to, it will switch on before the known erased device and if the unknown structure is in an erased state, the two devices will switch on at approximately the same time. Alternatively, a temperature compensation circuit can be used to produce a comparison voltage or current to be compared to a voltage or current produced by a programmable structure of an unknown state during a read process.

Erase Operation

A programmable structure (e.g., structure 200) may suitably be erased by reversing a bias applied during a write operation, wherein a magnitude of the applied bias is equal to or greater than the threshold voltage for electrodeposition in the reverse direction. In accordance with an exemplary embodiment of the invention, a sufficient erase voltage ($V \geq V_T$) is applied to structure 200 for a period of time, which depends on energy supplied during the write operation, but is typically less than about 1 millisecond to return structure 200 to its "off" state having a resistance well in excess of a million ohms. In cases where the programmable structure does not include a barrier between conductor 140 and electrode 120, a threshold voltage for erasing the structure is much lower than a threshold voltage for writing the structure because, unlike the write operation, the erase operation does not require electron tunneling through a barrier or barrier breakdown.

Control of Operational Parameters

The concentration of conductive material in the ion conductor can be controlled by applying a bias across the programmable device. For example, metal such as silver may be taken out of solution by applying a negative voltage in excess of the reduction potential of the conductive material. Conversely, conductive material may be added to the ion conductor (from one of the electrodes) by applying a bias in excess of the oxidation potential of the material. Thus, for example, if the conductive material concentration is above that desired for a particular device application, the concentration can be reduced by reverse biasing the device to reduce the concentration of the conductive material. Similarly, metal may be added to the solution from the oxidizable electrode by applying a sufficient forward bias. Additionally, it is possible to remove excess metal build up at the indifferent electrode by applying a reverse bias for an extended time or an extended bias over that required to erase the device under normal operating conditions. Control of the conductive material may be accomplished automatically using a suitable microprocessor.

The threshold voltage of programmable devices may be manipulated in accordance with various embodiments of the present invention using, for example, the write and erase procedures described above. Manipulation of the threshold voltage allows configuration of the programmable devices for desired read and write voltages. In general, as noted above, the threshold voltage depends on, among other things, an amount of conductive material present in the ion conductor and/or any barrier.

Figure 4:
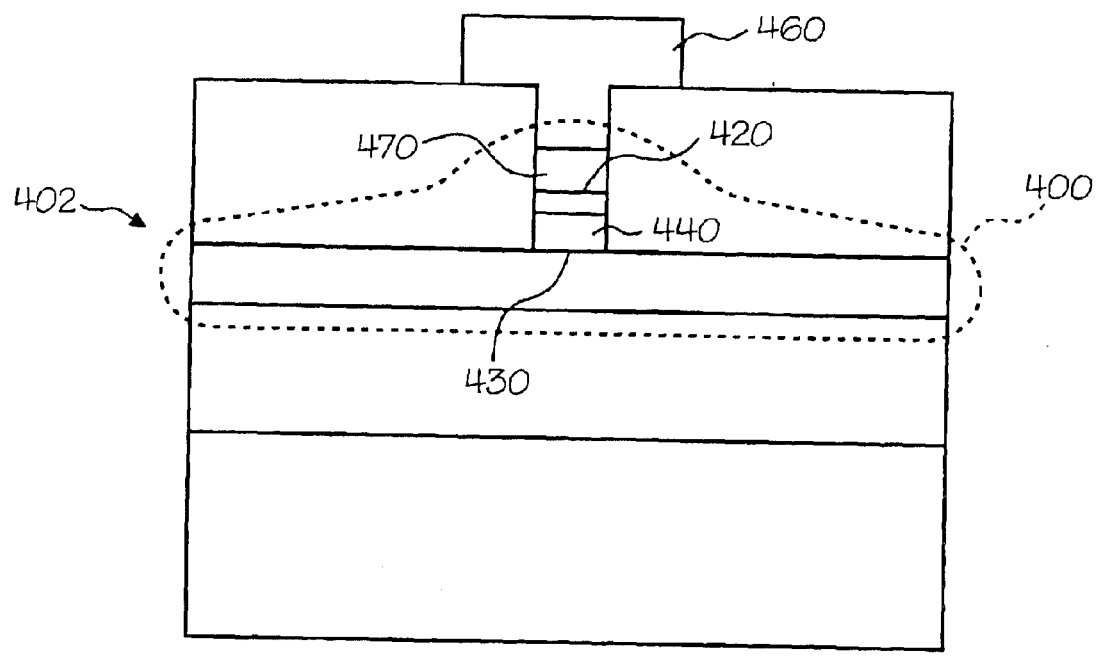

A portion of an integrated circuit 402, including a programmable structure 400, configured to provide additional isolation from electronic components is illustrated in FIG. 4. Structure 400 includes electrodes 420 and 430, an ion conductor 440, a contact 460, and an amorphous silicon diode 470, such as a Schottky or p-n junction diode, formed between contact 460 and electrode 420. Rows and columns of programmable structures 400 may be fabricated into a high density configuration to provide extremely large storage densities suitable for memory circuits. In general, the maximum storage density of memory devices is limited by the size and complexity of the column and row decoder circuitry. However, a programmable structure storage stack can be suitably fabricated overlying an integrated circuit with the entire semiconductor chip area dedicated to row/column decode, sense amplifiers, and data management circuitry (not shown) since structure 400 need not use any substrate real estate. In this manner, storage densities of many gigabits per square centimeter can be attained using programmable structures of the present invention. Utilized in this manner, the programmable structure is essentially an additive technology that adds capability and functionality to existing semiconductor integrated circuit technology.

Figure 5:
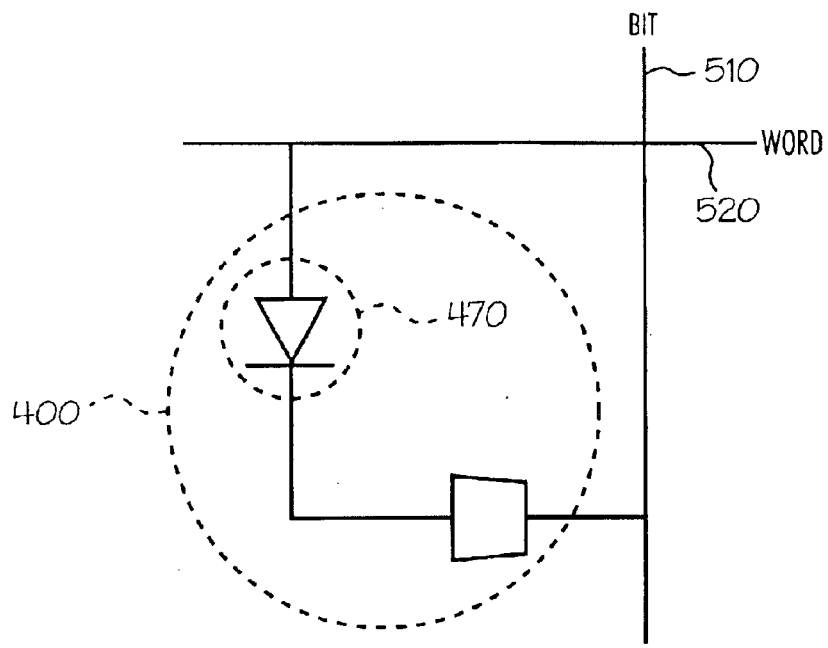
FIGS. 5 and 6 are schematic illustrations of a portion of a memory device in accordance with an exemplary embodiment of the present invention.
Figure 6:
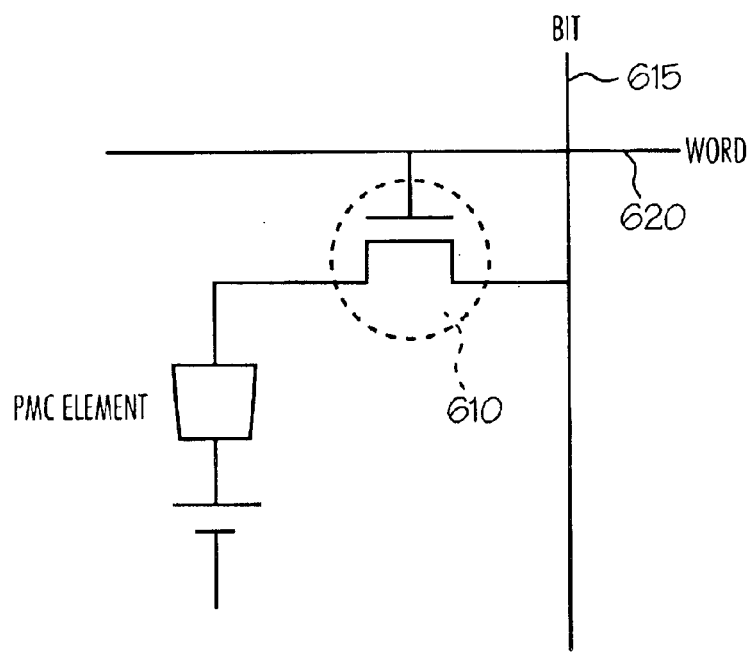

FIG. 5 schematically illustrates a portion of a memory device including structure 400 having an isolating p-n junction 470 at an intersection of a bit line 510 and a word line 520 of a memory circuit. FIG. 6 illustrates an alternative isolation scheme employing a transistor 610 interposed between an electrode and a contact of a programmable structure located at an intersection of a bit line 610 and a word line 620 of a memory device.

Figure 7:
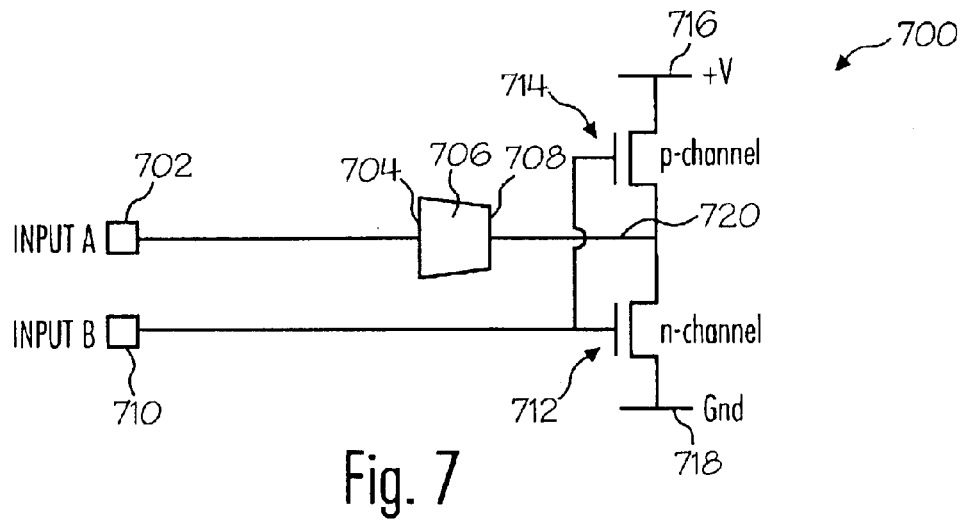
FIGS. 7–10 illustrate programming circuits in accordance with the present invention.

FIG. 7 illustrates an exemplary circuit 700 for altering an electronic property of a microelectronic device such as the programmable devices illustrated in FIGS. 1, 2, and 4. In general, circuit 700 is configured to supply an adequate, reversible voltage drop across a programmable structure to perform write and erase functions described above.

Circuit 700 includes a first input 702 coupled to a first portion 704 of a programmable device 706, a second input 710 coupled to a first switch 712 and a second switch 714, a voltage source 716 coupled to switch 714, and a ground 718 coupled to switch 712. In this embodiment, a second portion 708 of device 706 is coupled to both the first switch and the second switch. In accordance with an exemplary aspect of this illustrative embodiment, switch 712 and switch 714 form a complementary metal-oxide semiconductor (CMOS) device, where switch 714 is a p-channel transistor and switch 712 is an n-channel transistor, and wherein an output 720 of the CMOS device is coupled to portion 708 of programmable device 706. In this case; input 710 is coupled to a gate of the p-channel transistor and to a gate of the n-channel transistor. Forming switches 712 and 714 as part of a CMOS device allows for read and write operations to be performed with relatively low energy dissipation and also allows for relatively easy manufacture of circuit 700. In accordance with alternative aspects of this embodiment, p-channel transistor 714 may suitably be replaced with a passive load such as resistor (e.g., a poly silicon resistor) or an active load (e.g., a depletion mode MOS transistor). Also, as noted above, the CMOS device may be formed within a substrate (e.g., substrate 110) and programmable device 706 may be formed overlying the substrate.

In operation, when programmable device 706 is in an unwritten or erased state and a low voltage (e.g., about 0 V) is applied to both input 702 and input 710, the indifferent electrode of device 706 (portion 708) is biased positive relative to the soluble electrode (portion 704). In this state, a write process will not occur. When a positive voltage (e.g., about 5 volts—near +V) is applied to both input 702 and input 710, the voltage at portion 708 will drop to about 0 V and, so long as the positive voltage at input 702 is large enough to cause a voltage drop in excess of the write threshold voltage (e.g., about 200–300 mV), circuit 700 will perform a write function on device 706 as described above. To erase device 706, the low voltage of about 0 V can be applied to both input 702 and input 710 to cause portion 708 of device 706 to be positively biased compared to portion 704 of device 706. Alternatively, voltages of opposite polarity may be applied to input 702 and 710 to cause write and erase functions as described herein.

Figure 8:
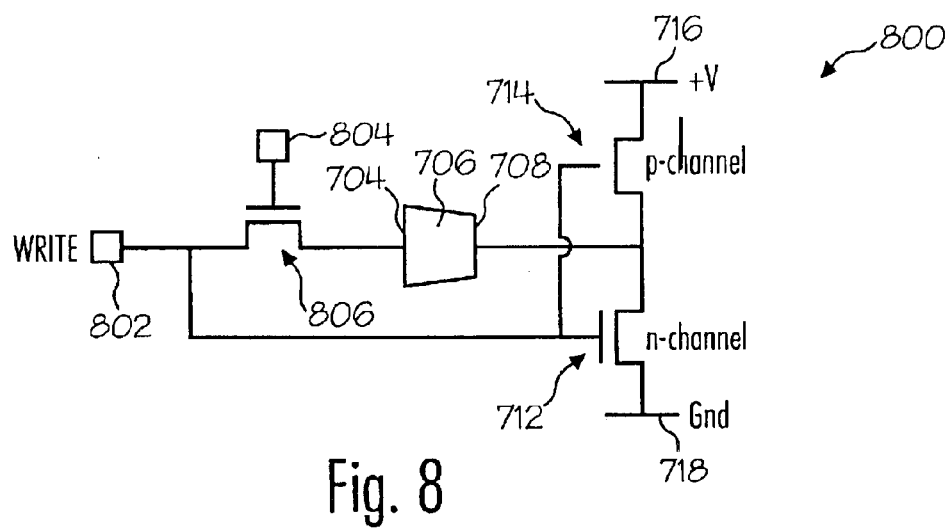

FIG. 8 illustrates a circuit 800, for programming a programmable structure, in accordance with another embodiment of the invention. Circuit 800 is similar to circuit 700, except circuit 800 includes only a single input 802 and additionally includes a select input 804 and a switch 806 for enabling a read or write function.

During operation of circuit 800, a write or erase function is performed by application of a suitable bias (e.g., about 1 to 5 V—near +V) to input 804 to activate switch 806, which in the illustrated embodiment of the invention is a MOS transistor. Once enabled, a write function can be performed upon application of a high voltage (e.g., about 1 to 5 V—near +V) to input 802, and an erase can be performed upon application of a low voltage (e.g., about 0 V) to input 802. During a write process, the resistance across device 706 decreases. This phenomenon can be used to self-limit the programming effect by allowing the voltage at input 802 to be pulled lower as the programming function proceeds.

Figure 9:
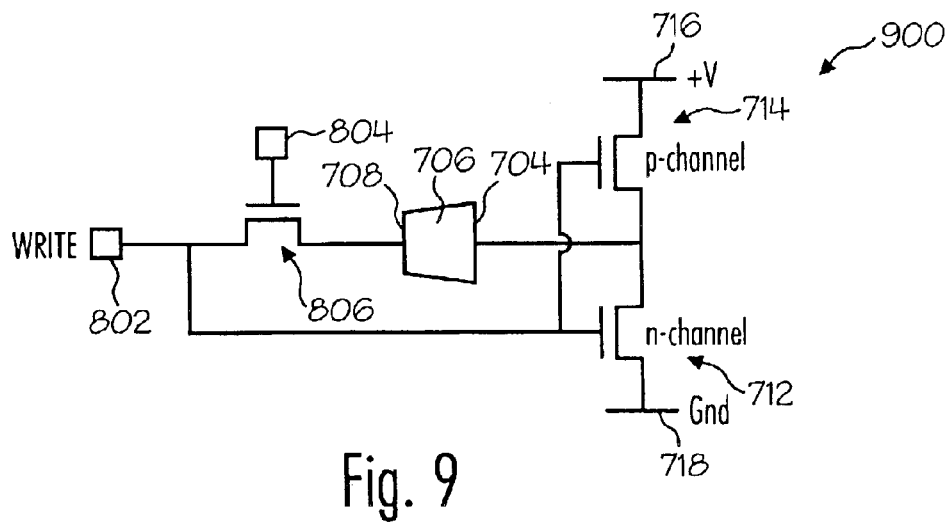

FIG. 9 illustrates another circuit 900 in accordance with the present invention. Circuit 900 is similar to circuit 800, except the orientation of programmable structure 706 is reversed with respect to input 802. In this case, a low voltage at input 802 causes a write event and a high voltage at input 802 causes an erase event.

Figure 10:
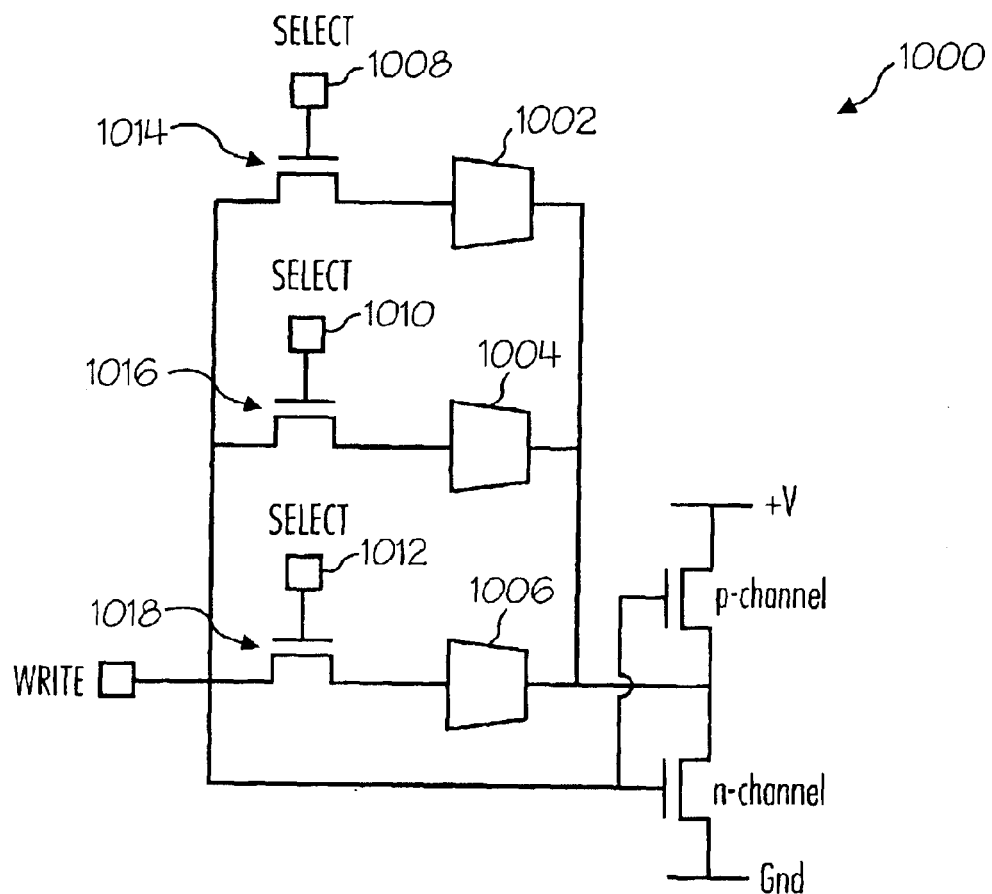

FIG. 10 illustrates a circuit 1000 including a plurality of programmable devices 1002–1006. Circuit 1000 may form a portion of a memory array—e.g., a portion of a column of the array. Circuit 100 is similar to circuit 800, except that circuit 1000 includes a plurality of select inputs 1008, a plurality of programmable devices, and a plurality of select switches (e.g., MOS transistors) 1014–1018. In accordance with an exemplary embodiment of the invention, a single programmable device is selected for a read or write operation by turning on the corresponding select switch.

Although the present invention is set forth herein in the context of the appended drawing figures, it should be appreciated that the invention is not limited to the specific form shown. For example, while the programming circuit is conveniently illustrated with MOS transistors as switches, the invention is not so limited; the circuit of the present invention may additionally or alternatively include bipolar transistors or the like to form the illustrated switches. Various other modifications, variations, and enhancements in the design and arrangement of the method and apparatus set forth herein, may be made without departing from the spirit and scope of the present invention as set forth in the appended claims.

I claim:

1. A circuit for programming a microelectronic memory device, the circuit comprising:
   a first input coupled to a first portion of the memory device;
   a second input coupled to a first switch and a second switch, the first switch coupled to a voltage source and the second switch coupled to ground; and
   wherein the circuit is configured to provide a first bias and a second to the memory device wherein the polarity of the first bias is opposite the polarity of the second bias.

2. The circuit of claim 1, wherein the first switch and the second switch form a CMOS device.

3. The circuit of claim 2, wherein the output of the CMOS device is coupled to a second portion of the memory device.

4. The circuit of claim 1, wherein the memory device comprises a first electrode, a second electrode, and an ion conductor interposed between the first electrode and the second electrode.

5. The circuit of claim 4, wherein the ion conductor comprises a chalcogenide material.

6. A circuit for reversibly altering an electrical property of a microelectronic device, the circuit comprising:
   a write input coupled to a first portion of the microelectronic device;
   a select switch coupled between the write input and the first portion of the microelectronic device;
   a first switch coupled to the write input and a voltage source; and
   a second switch coupled to write input and ground,
   wherein the first switch and the second switch are coupled to a second portion of the microelectronic device, and
   wherein the circuit is configured to provide a first bias and a second to the microelectronic device wherein the polarity of the first bias is opposite the polarity of the second bias.

7. The circuit of claim 6, wherein the first switch and the second switch form a CMOS device.

8. The circuit of claim 7, wherein the select switch comprises an MOS transistor.

9. The circuit of claim 6, wherein the microelectronic device comprises an ion conductor material selected from the group consisting of glass, semiconductor material, chalcogenide material, and polymer material.

10. The circuit of claim 6, wherein the first portion comprises soluble electrode material.

11. The circuit of claim 6, wherein the second portion comprises indifferent electrode material.

12. The circuit of claim 6, wherein the first portion comprises indifferent electrode material.

13. The circuit of claim 6, wherein the second portion comprises soluble electrode material.

14. The circuit of claim 6, further comprising a plurality of microelectronic devices coupled to the first switch and the second switch.

15. The circuit of claim 14, further comprising a plurality of select switches coupled to the write input.

16. A circuit for programming a programmable structure, the circuit comprising:
    a write input coupled to a first portion of the structure;
    a CMOS transistor having an output coupled to a second portion of the structure and to the write input; and
    a select transistor coupled between the wrote input and the programmable structure, wherein the programmable structure comprises an ion conductor and conductive material dispersed within the ion conductor.

17. The circuit of claim 16, further comprising a plurality of programmable structures coupled to the output of the CMOS transistor.

18. The circuit of claim 16, further comprising a plurality of select transistors coupled to the write input.

19. The circuit of claim 16, wherein the select transistor is a MOS transistor.

* * * * *